(12) United States Patent
Montaru

(10) Patent No.: US 10,989,761 B2
(45) Date of Patent: Apr. 27, 2021

(54) METHOD FOR ESTIMATING THE STATE OF HEALTH OF A BATTERY

(71) Applicant: RENAULT s.a.s., Boulogne Billancourt (FR)

(72) Inventor: Maxime Montaru, Joursac (FR)

(73) Assignee: RENAULT s.a.s., Boulogne Billancourt (FR)

( * ) Notice: Subject to any disclaimer, the term of this patent is extended or adjusted under 35 U.S.C. 154(b) by 779 days.

(21) Appl. No.: 15/303,963

(22) PCT Filed: Apr. 16, 2015

(86) PCT No.: PCT/EP2015/058252
§ 371 (c)(1),
(2) Date: Oct. 13, 2016

(87) PCT Pub. No.: WO2015/158813
PCT Pub. Date: Oct. 22, 2015

(65) Prior Publication Data
US 2017/0038436 A1    Feb. 9, 2017

(30) Foreign Application Priority Data
Apr. 16, 2014 (FR) ..................... 1453408

(51) Int. Cl.
*G01R 31/36* (2020.01)
*H01M 10/42* (2006.01)
(Continued)

(52) U.S. Cl.
CPC ......... *G01R 31/392* (2019.01); *G01R 31/367* (2019.01); *H01M 10/425* (2013.01); *H01M 2010/4271* (2013.01)

(58) Field of Classification Search
CPC . G01R 31/392; G01R 31/367; H01M 10/425; H01M 2010/4271
See application file for complete search history.

(56) References Cited

U.S. PATENT DOCUMENTS

2002/0030494 A1    3/2002   Araki et al.
2010/0036626 A1*   2/2010   Kang ................ G01R 31/3648
                                                               702/63
(Continued)

FOREIGN PATENT DOCUMENTS

| FR | 2 955 670 A1 | 7/2011 |
| JP | 2012-57956 A | 3/2012 |
| JP | 2013-247003 A | 12/2013 |

OTHER PUBLICATIONS

International Search Report dated Jul. 7, 2015 in PCT/EP2015/058252 filed Apr. 16, 2015.
(Continued)

*Primary Examiner* — Regis J Betsch
*Assistant Examiner* — Jeremy A Delozier
(74) *Attorney, Agent, or Firm* — Oblon, McClelland, Maier & Neustadt, L.L.P.

(57) ABSTRACT

A method calibrates a battery allowing calibration data linked to its state of health to be memorized. The method includes determining at least one characteristic state of the battery, between fully charged and fully discharged, by detecting a peak in variation of the derivative of its open-circuit voltage while charging or discharging the battery, or at least one characteristic state when it is fully charged or fully discharged, or defined by crossing of a voltage, or current, threshold in a constant current, or constant voltage, phase while charging or discharging the battery. The method also includes defining a reference state of the battery based on this characteristic state and measuring the open-circuit voltages of the battery in the reference state for multiple different states of health and memorizing these calibration data including at least some pairs of actual state of health/open-circuit voltage values in an electronic memory.

17 Claims, 4 Drawing Sheets

(51) Int. Cl.
*G01R 31/392* (2019.01)
*G01R 31/367* (2019.01)

(56) References Cited

U.S. PATENT DOCUMENTS

| | | |
|---|---|---|
| 2012/0035873 A1 | 2/2012 | Kang et al. |
| 2012/0105068 A1 | 5/2012 | Wang et al. |
| 2012/0296586 A1 | 11/2012 | Kirchev |
| 2013/0166234 A1 | 6/2013 | Chou et al. |
| 2016/0146898 A1* | 5/2016 | Lennevi .................. B60L 58/16 324/426 |
| 2016/0202324 A1* | 7/2016 | Biletska ............. G01R 31/3651 702/63 |

OTHER PUBLICATIONS

English translation of the Japanese Office Action dated Jan. 22, 2019 in Patent Application No. 2016-562914, 3 pages.

* cited by examiner

METHOD FOR ESTIMATING THE STATE OF HEALTH OF A BATTERY

BACKGROUND

The invention relates to a method for estimating the state of health of a battery. It also relates to a method for calibrating a battery, and a method for managing a battery. Lastly, it also relates to a battery management system implementing this method for estimating the state of health of a battery.

The management of batteries in the prior art makes use of an indicator representative of the aging of a battery, often referred to as its state of health or SOH. This indicator, sometimes also referred to as its state of life, is usually expressed as a percentage of the initial capacity of the battery when new, which capacity is measured in this initial state or provided by the manufacturer of the battery. The SOH is commonly used in the diagnosis of a battery. Its evaluation is important for effectively controlling the operation of the battery, as well as for optimally managing the end of its life.

In a first approach, the actual value of the SOH is measured by carrying out a capacity test, consisting in successively fully charging then fully discharging the battery under chosen current and temperature conditions. While discharging, the quantity of charge released is measured, thereby allowing the actual capacity of the battery, and hence its SOH, to be deduced. The advantage of this method is that the actual value of the SOH is obtained, since it is based on a real measurement. However, its drawbacks are that it takes a substantial amount of time, consumes power, and requires an intervention in the battery that is sometimes incompatible with the normal use thereof, i.e. supplying power in order to implement a certain real application: it then requires this application to be paused so that the battery test can be carried out. For this last reason, this first approach is considered to be intrusive since it generally requires the normal use of the battery to be put on hold.

In order to overcome the drawbacks of measuring the actual SOH, other, less intrusive approaches exist, based on the estimation thereof. By way of example, a common method for estimating the SOH consists in tracking the variation in the resistance of the battery, or, by extension, tracking one or more impedance parameters of the battery. Battery fatigue is indeed generally accompanied by a variation in these parameters. The drawback of this method is that the loss of capacity of the battery is not measured directly, but instead estimated on the basis of the variation in a different parameter, while being highly dependent on the measurement of the temperature. However, the variation in losses of capacity and in increases in resistance, or impedance, does not follow laws that can be generalized for all batteries, nor for all aged states of batteries. Thus, there are situations in practice where the increase in the resistance of a battery is sometimes negligible while the battery is undergoing a substantial loss of capacity, and vice versa. This estimation method is therefore not sufficiently reliable, and is often complex due to it requiring additional calculations based, for example, on prior learning in order to attempt to overcome its failings.

BRIEF SUMMARY

Thus, a general object of the invention is to propose a solution for estimating the SOH of a battery that does not comprise any or some of the drawbacks of the prior art.

More specifically, an object of the invention is to propose a reliable, quick and non-intrusive solution for estimating the SOH of a battery.

To this end, the invention is based on a method for calibrating a battery allowing calibration data linked to its state of health to be memorized, characterized in that it comprises the following steps:

determining at least one characteristic state of the battery, intermediate between fully charged and fully discharged, by detecting a peak in the variation of the derivative of its open-circuit voltage while charging or discharging the battery, or at least one characteristic state when it is fully charged or fully discharged, or defined by the crossing of a voltage, or current, threshold in a constant current, or constant voltage, phase while charging or discharging the battery;

defining a reference state of the battery on the basis of this characteristic state;

measuring the open-circuit voltages OCVi of the battery in the reference state for multiple different states of health SOHi and memorizing these calibration data comprising at least some pairs of actual state of health/open-circuit voltage (SOHi, OCVi) values in an electronic memory.

The step of determining at least one characteristic state of the battery may take into account the derivative of its open-circuit voltage with respect to the quantity of charge accumulated by the battery or with respect to time.

The reference state may be chosen in a stabilized area of the derivative of the open-circuit voltage in proximity to the peak of the detected characteristic state.

The reference state may be defined by a shift by a fixed charge Q1 in the charge accumulated by the battery with respect to its charge at the detected peak.

The method for calibrating a battery may comprise the repetition of the following steps for multiple different states of health of at least one battery:

placing a battery in a known and chosen state of health SOHi;

charging or discharging the battery, measuring and/or estimating the derivative of the open-circuit voltage of the battery and detecting the predefined peak in the derivative;

continuing to charge or discharge a predefined quantity of charge on the basis of the predefined peak in order to attain the reference state of the battery, and measuring its open-circuit voltage OCVi in this reference state;

memorizing, in an electronic memory comprising the calibration data, the pair of values comprising the value of the state of health SOHi and the open-circuit voltage OCVi associated with the reference state of the battery.

The method for calibrating a battery may implement phases of slow charging or discharging of the battery in order to facilitate the measurement of the open-circuit voltage.

The open-circuit voltage of the battery may be obtained via one of the following steps:

measuring the voltage across the terminals of the battery when not connected to a load after a relaxation time of more than one hour; or measuring the voltage across the terminals of the battery when not connected to a load after a relaxation time of less than or equal to one hour; or measuring the voltage across the terminals of the battery despite a very weak current delivered or received by the battery; or measuring the voltage across the terminals of the battery under different conditions of the theoretical open-circuit voltage and implementing a correction for the measured voltage in order to estimate the open-circuit voltage;

estimating the open-circuit voltage of the battery on the basis of one or more measured electrical quantities of the battery.

The method for calibrating a battery may comprise a step of determining a law between the state of health of the battery and its open-circuit voltage in the reference state, in particular through linear interpolation and/or the construction of a chart associating a value of the state of health of the battery with a value of the open-circuit voltage of the battery in a reference state, on the basis of the pairs of actual state of health/open-circuit voltage (SOHi, OCVi) values.

The method for calibrating a battery may be implemented using at least one battery of the family of batteries in the new state, and using the same battery in at least one aged state.

The invention also pertains to a method for estimating the state of health of a battery, characterized in that it comprises a calibration phase implementing a calibration method such as described above, and a phase of estimating the state of health of the battery comprising the measurement of its open-circuit voltage in the reference state and deducing the estimation of its state of health from the calibration data obtained in the calibration phase and from the measured open-circuit voltage.

The second estimation phase may comprise all or some of the following preliminary steps, for the purpose of determining the triggering thereof:

trigger command subsequent to a request from a user via a human-machine interface of a device in which the battery is used or of a battery charging device; and/or automatic triggering at a predefined frequency; and/or automatic triggering when the electrical conditions of the battery are favorable;

automatic triggering in one phase of charging a battery;

AND/OR may comprise the following preliminary steps:

a step of automatically detecting the electrical situation of the battery in order to detect the characteristic state; or a step of modifying the configuration of the battery in order to place it in proximity to the reference state.

The method for estimating the state of health of a battery may implement the following steps:

measuring or estimating the derivative of the open-circuit voltage while charging or discharging the battery;

detecting a peak in this derivative of the open-circuit voltage;

placing the battery in its reference state on the basis of the peak in the derivative of the open-circuit voltage, and measuring the open-circuit voltage of the battery;

deducing the state of health of the battery from the calibration data and from the measured open-circuit voltage.

The invention also pertains to a computer medium readable by a management unit, characterized in that it comprises a recorded computer program comprising computer program code means for implementing the method for estimating the state of health of a battery such as described above.

The invention also pertains to a device comprising at least one battery and one management unit, characterized in that the management unit implements a method for estimating the state of health of at least one battery such as described above.

The device may be an automotive vehicle or a mobile object such as a computer, a telephone, a tablet or a personal digital assistant.

The invention also pertains to a device for calibrating a battery, characterized in that it implements a calibration method such as described above.

BRIEF DESCRIPTION OF THE DRAWINGS

These subjects, features and advantages of the present invention will be set forth in detail in the following description of one particular embodiment provided without limitation in conjunction with the attached figures, among which.

DETAILED DESCRIPTION

Figure 1:
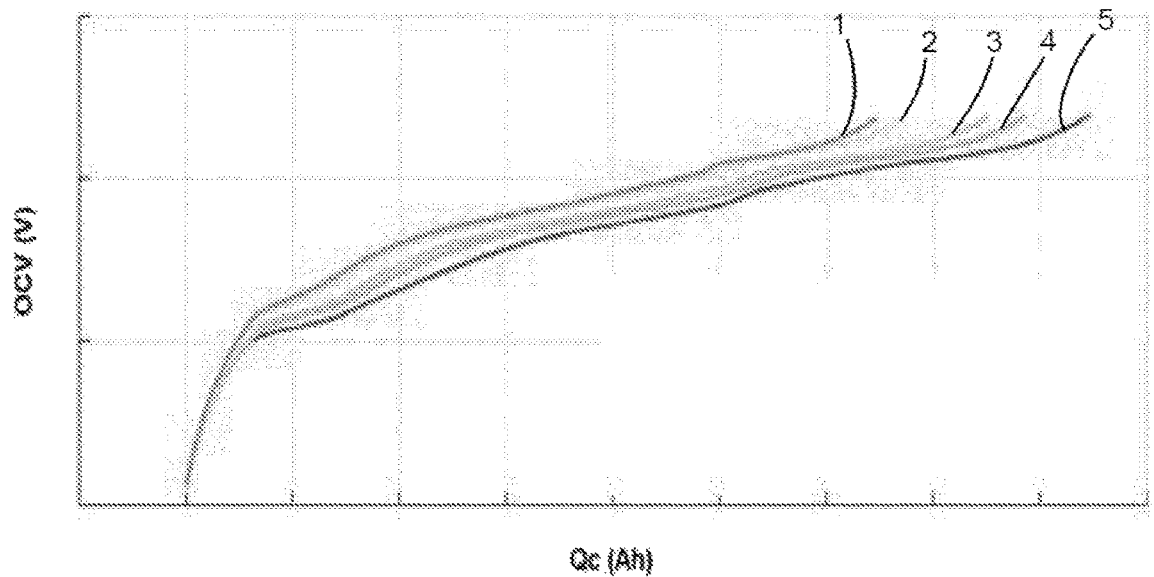
FIG. 1 shows multiple curves of the variation in the open-circuit voltage OCV of a battery as a function of the charge delivered to the battery in a charging phase for multiple respective state of health SOH values of the battery.

The method according to the invention makes use of the open-circuit voltage, or OCV, of a battery, which has the advantage of being independent of the temperature. This open-circuit voltage is defined as the voltage measured across the terminals of the battery when it is not in use, and after a relaxation period following the last time it was used, during which the voltage across its terminals varies until it converges toward a stabilized value, which is the open-circuit voltage.

It should be noted that this theoretical open-circuit voltage is rarely used as defined above, since it would need a relatively long relaxation time, often of several hours, in order to attain a stabilized voltage value across the terminals of the battery that may be likened to the open-circuit voltage, which is generally incompatible with the usage demands of a battery.

For this reason, the definition of open-circuit voltage is extended to values roughly approximating it, sometimes referred to as pseudo-open-circuit voltage, for reasons of ease of use of associated solutions. Thus, the term open-circuit voltage will be used hereinafter to also cover the following similar values of voltage across the terminals of a battery:

an open-circuit voltage measured after a shortened relaxation time, for which the voltage across the terminals of the battery may not be considered to have converged toward the theoretical open-circuit voltage value;

an open-circuit voltage measured despite a very weak current delivered or received by the battery, for example in the context of a very slow charging phase, such as C/25, where C is the recommended nominal charging regime;

an open-circuit voltage estimated on the basis of one of the voltage measurements under different open-circuit voltage conditions defined above, such as in the two configurations mentioned above, while applying a correction in order to take this situation into account, in particular the voltage drop due to the impedance of the battery;

an open-circuit voltage estimated on the basis of any other electrical measurement or electrical estimation of the battery;

an open-circuit voltage measured or estimated via one of the approaches mentioned above in a phase of charging or discharging a battery. It should be noted that not exactly the same value of the open-circuit voltage across the terminals of a battery is obtained for the charging or discharging phases, on relaxation. There are therefore potentially two open-circuit voltage values, for charging and discharging, respectively. One of the two values is therefore considered, or, in a variant, a mean value of the charging and discharging open-circuit voltages.

Thus, the method according to the embodiment of the invention, which will be described below, may be implemented using any one of the above approaches to define the open-circuit voltage OCV. However, it will be necessary to use the same definition of this open-circuit voltage in all of the steps of this method for calibrating and estimating the SOH in order to obtain the most consistent and precise result possible.

FIG. 1 comprises five curves 1 to 5 of the variation in the open-circuit voltage OCV (in V) of a battery as a function of the quantity of charge Qc (in Ah) accumulated by the battery in a charging phase, obtained, respectively, for respective states of health SOHi (i varying from 1 to 5) of the battery of 73%, 75%, 85%, 89% and 100%. These curves show that the value of the state of health SOH of a battery, for a given charge, depends on its open-circuit voltage.

Figure 2:
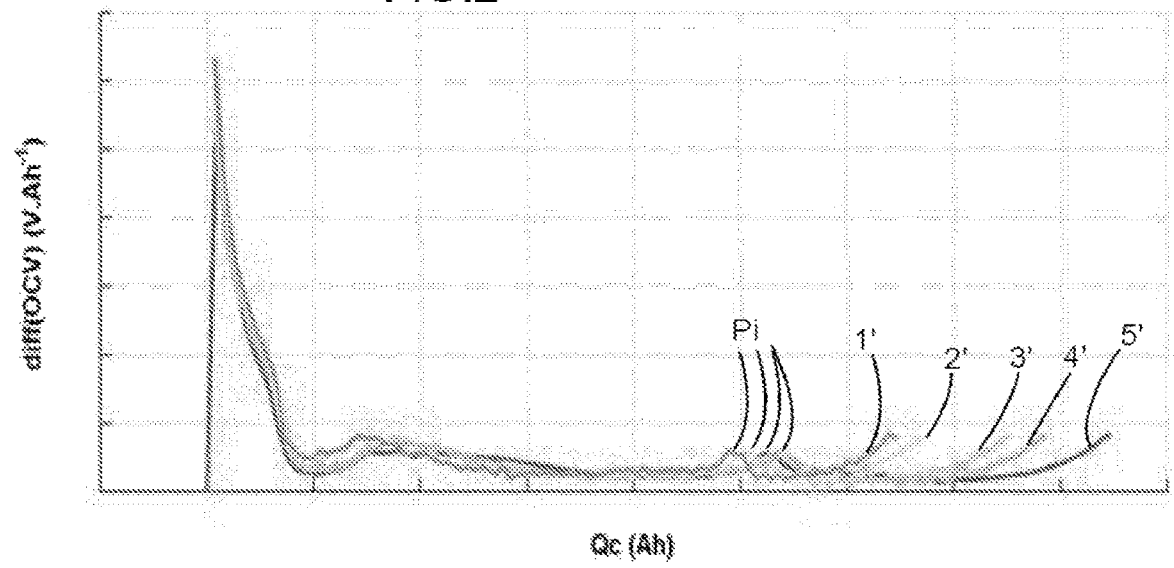
FIG. 2 shows multiple curves of the variation in the derivative of the function representing the open-circuit voltage OCV of a battery by the charge delivered to the battery in a charging phase as a function of this charge for multiple respective state of health SOH values of the battery.

On the basis of the curves 1 to 5 of this FIG. 1, five curves 1' to 5' are plotted in FIG. 2, representing, respectively, the values of the derivative of the open-circuit voltage function as a function of the quantity of charge, for the five curves 1 to 5, respectively. These curves all comprise a peak Pi (i varying from 1 to 5). These various peaks Pi are slightly offset with respect to one another, i.e. obtained for various levels of quantities of charge Qc of the battery for various states of health SOH of the battery. These peaks show local maxima of these derivatives.

Analyses have shown that the observed peaks correspond to a particular physical state of the battery, in which a phase transition occurs at these two electrodes. This particular state (or characteristic state) shifts as the battery ages. It is easily detectable by simply observing the curves 1' to 5'. It will be used to define an intermediate reference state of the battery for the estimation of its state of health, as will be described below.

The preceding conclusions will therefore be used in order to implement an estimation of the state of health of a battery according to the two following principles:

this state of health will be deduced from the open-circuit voltage of the battery;

this state of health will be estimated for an intermediate state of charge of the battery, between fully charged and fully discharged.

One detailed embodiment of the invention will now be described.

Figure 6:
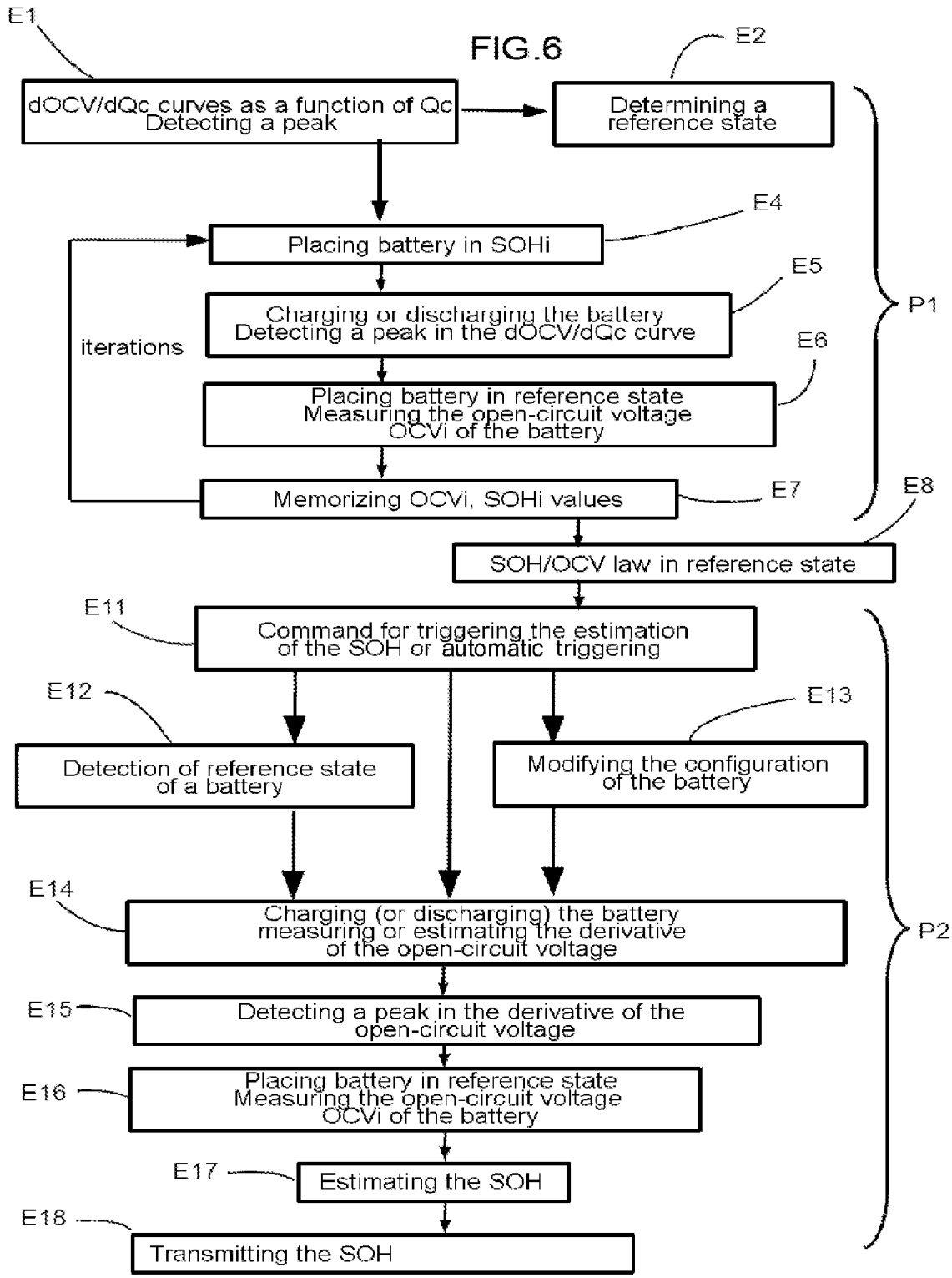
FIG. 6 schematically shows a flow diagram of a method for estimating the state of health of a battery according to one embodiment of the invention.

This embodiment is based on a method for estimating the state of health of a battery, schematically shown by the diagram of FIG. 6, which comprises the two following phases:

a first, preliminary phase P1 is based on a calibration method allowing calibration data to be calculated, comprising reference values of the state of health SOH of a certain battery as a function of its open-circuit voltage for a certain reference state;

a second phase P2 of estimating the SOH while the battery is in use, on the basis of the results of the calibration method.

It should be noted that in this first, calibration phase, the SOH of a battery used for the calibration is calculated via a known and very precise method, in order to set up a precise calibration using actual SOH values so as to achieve a high level of performance in future estimations.

According to the embodiment, the calibration method initially comprises a first step E1 consisting in searching for at least one peak Pi of a curve dOCV/dQc as a function of the quantity of charge Qc of a battery. For this purpose, at least one of the curves 1'to 5' is plotted by carrying out a charging operation and measuring OCV values at a high frequency, i.e. a test procedure allowing OCV values with intervals that are sufficiently small with respect to the variations in the dOCV/dQ curve to be obtained, in order to obtain a precise curve and ensure that a peak is indeed detected. Once the geometry of the selected peak has been identified, an OCV measurement frequency that is sufficiently high in order to detect the peak is chosen, while avoiding a frequency that is so high that the method is slowed down by an overly large number of OCV measurements. A second embodiment would consist in defining a characteristic state that can be detected by using the voltage (or current) measurement via the crossing of a voltage (or current) threshold at a constant current (or voltage) for a certain temperature during charging or discharging. The remainder of the description will be given in detail in the context of one embodiment associated with the detection of a peak.

A second step E2 consists in determining a reference state of the battery on the basis of the one or more identified peaks, which characterize a particular state of the battery. This reference state is preferably not chosen at the peak itself as, by definition, the value of the open-circuit voltage OCV varies more strongly with the quantity of charge Qc at this peak, this area thereby being unfavorable. Specifically, the estimation method will be based on measuring the open-circuit voltage of the battery at the reference state and it is more advantageous for this value to be relatively stable around this reference state in order to minimize errors. For this reason, the reference state of the battery is chosen outside the peak, in an area where the value of the derivative is low, and hence where the OCV values are relatively stable. However, this reference state remains as close as possible to the identified peak, in order not to complicate the identification thereof, which will be carried out on the basis of the subsequent peak detection. Thus, the reference state is preferably distinct from a characteristic state detected by a peak, as explained above.

Figure 3:
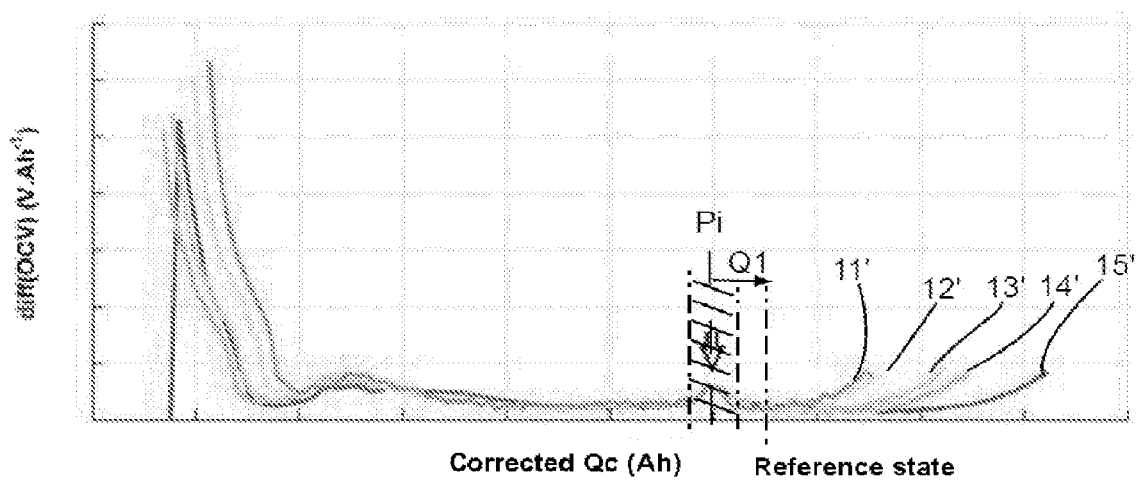
FIG. 3 shows the same curves as those of FIG. 2, but corrected with respect to one another.

In order to illustrate this choice of the reference state in the illustrated example, a FIG. 3 is constructed in which five curves 11' to 15' are plotted, corresponding, respectively, to the curves 1' to 5' of FIG. 2, but shifted in order to superpose their peaks Pi representing the intermediate particular state of the battery. Following on from the preceding explanations, it is chosen to determine the reference state of the calibration method outside the hashed area surrounding the peak, where the value of the derivative is higher. Lastly, in the described embodiment, the reference state is defined by a predetermined charge Q1 of the battery charge from a peak Pi, which allows a distance to be taken from the non-recommended area, while still remaining in proximity. The difference between a peak Pi and the reference state in proximity is preferably less than or equal to 5 Ah, or even 3 Ah. By way of exemplary embodiment, it is also preferably greater than or equal to 2 Ah.

Figure 4:
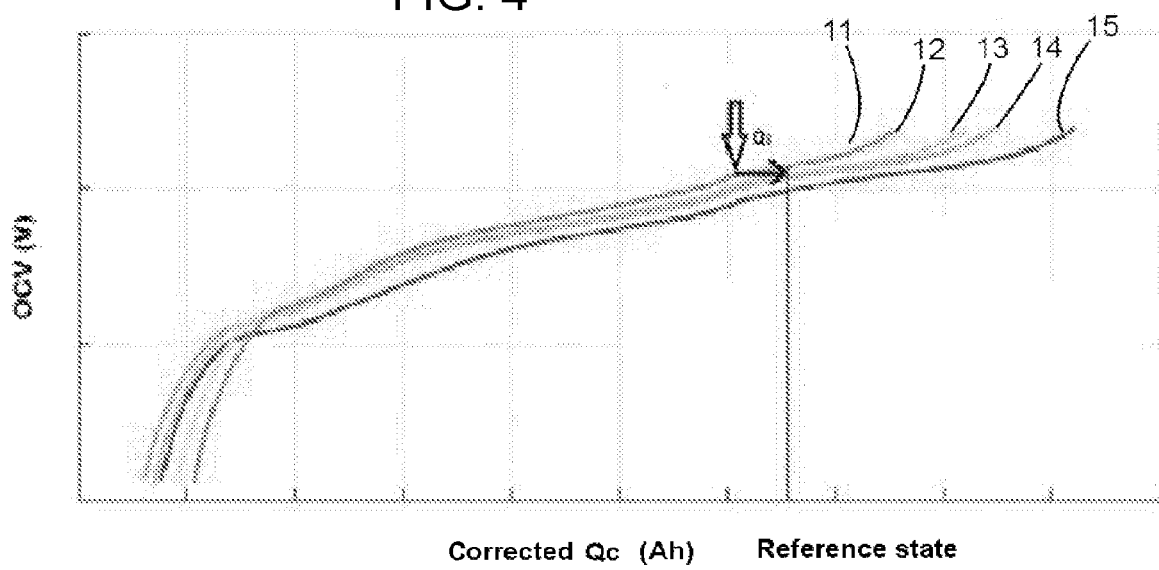
FIG. 4 shows the same curves as those of FIG. 1, but corrected according to the correction defined by FIG. 3.

FIG. 4 illustrates five curves 11 to 15 corresponding, respectively, to the curves 1 to 5 that have been shifted according to the shift explained above, in order to superpose their reference state.

The two preceding steps E1, E2 may be implemented for a single SOH value of the battery, which is sufficient in order to detect a peak and to choose a reference state. In a variant, the accuracy of a peak may be validated by repeating these steps for multiple different states of health of the battery.

Next, once these two preliminary steps have been carried out, the method implements an iteration of the following steps (according to the chosen number of separate states of health and/or the chosen number of batteries), for multiple known states of health of a battery:

E4: placing the battery in a known and chosen state of health SOHi;

E5: charging the battery, measuring the quantity of charge and the open-circuit voltage, and, above all, the derivative of the open-circuit voltage with respect to the charge, and detecting the predefined peak;

E6: continuing to charge a value Q1 on the basis of the identified peak in order to attain the reference state of the battery, and measuring its open-circuit voltage;

E7: memorizing, in an electronic memory, the value of the state of health SOH and the associated open-circuit voltage OCV, these two values being obtained in the reference state of the battery. The pair (OCV, SOH) forms a reference datum, a datum for calibrating the battery.

It should be noted that, during the implementation of step E5, the initial state of the battery may be its fully discharged state, thereby allowing the overall charge of the battery to be measured when charging and providing a useful indication for confirming the detection of the correct desired peak, whose position with respect to the charge of the battery is in a relatively restricted known range. In a variant, this charging could begin in a state in which the battery is not fully discharged, but at a level of charge lower than that of the peak (i.e. to the left of the desired peak of FIG. 3).

On the other hand, this charging is carried out according to a very slow charging regime, for example of C/25, which leads to very weak currents and allows the voltage across the terminals of the battery to be measured, forming a pseudo-open-circuit voltage. In a variant, the battery is allowed to relax before each voltage measurement. Moreover, this open-circuit voltage measurement and measurement and/or estimation of the derivative of the open-circuit voltage is carried out periodically, according to a period defined beforehand in a manner compatible with the detection of the desired peak.

Lastly, multiple pairs of actual values (OCVi, SOHi) are thus obtained by the calibration method, for each state of health SOH value of the battery for which the preceding steps E4 to E7 are implemented. By way of example, these pairs of actual values are illustrated by points Ci on the graph of FIG. 5.

Figure 5:
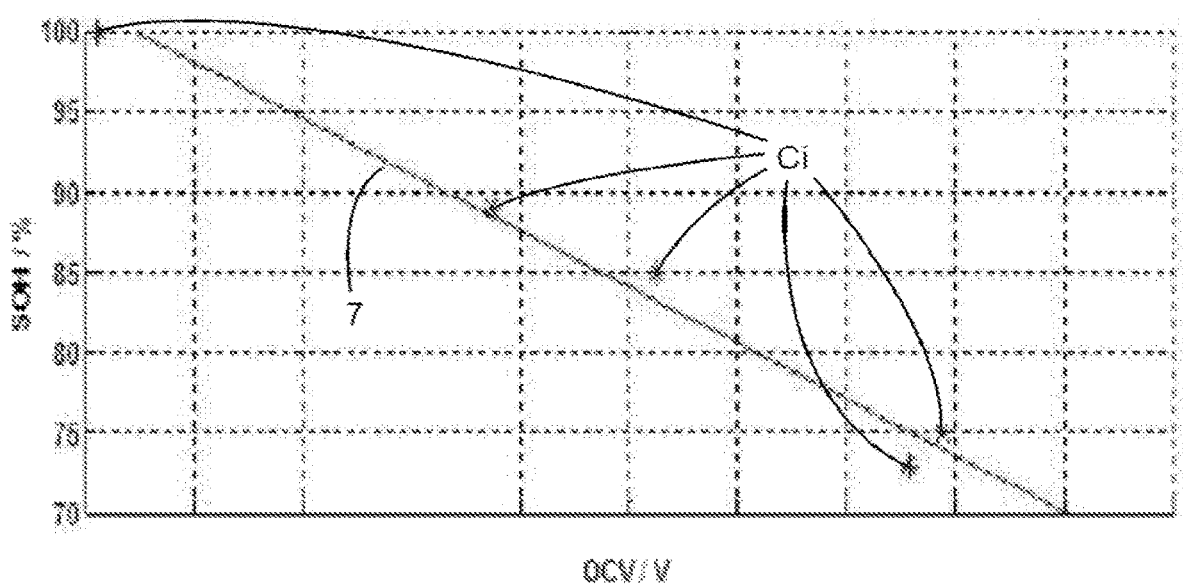
FIG. 5 shows the relationship between the state of health SOH of the battery and the open-circuit voltage OCV of the battery in a reference state of the battery, which state is defined by the embodiment of the invention.

Next, the calibration method according to this embodiment comprises another step of formulating a law E8 between the SOH and the OCV of the battery at the reference state, in order to obtain a future estimation of the state of health SOH of the battery for all open-circuit voltage OCV values on the basis of a few actually measured discrete values, represented by the points Ci. In the chosen example, FIG. 5 shows, by plotting the straight line 7, a linear relationship between the SOH and the OCV in the reference state of the battery. The parameters allowing this straight line to be characterized, or, more generally, the law determined on the basis of the actual points Ci and formulated, for example, using any mathematical interpolation method, may also be memorized with the calibration data. It should be noted that this step E8 may, in a variant, be carried out later, when the battery is in use for example, and not necessarily in the calibration phase.

Other parameters, such as those allowing the charging of the battery implemented in the calibration phase to be characterized, may also be memorized as reference data, since the method will be implemented by preferably using the same charging conditions, for which the reference data are the most relevant. However, it is not obligatory to reproduce the same conditions for charging as those for calibration, the calibration data remaining usable under any other charging conditions.

In addition, the chosen method for calculating the open-circuit voltage of the battery is also memorized, in order to always reproduce the same calculation, as described above. Moreover, the optimum frequency for measuring the OCV while charging may also be memorized, so that it may potentially be used in future estimations, and ensure that the peak in the derivative of the open-circuit voltage is correctly detected. Lastly, the approximate position of this peak may also be memorized, for example within a range of charge values of the battery.

Of course, this calibration phase P1 may be carried out once (on one battery) for a certain family of batteries, or even multiple times, in particular on multiple batteries, in order to formulate a mean that is hopefully more precise, the results then subsequently being applicable to all batteries of the family operating according to this same technology, when they are used in a system.

Moreover, this calibration phase may be carried out for a predetermined number of SOH values of the battery, representing a compromise between the obtained precision, which increases as the number of SOHs increases, and the simplicity of the calibration phase, which gets simpler and quicker as the number of SOHs decreases. Subsequently, if a high level of precision is desired, it is possible to increase the number of actual SOH values considered. Advantageously, at least two points are calibrated (which may actually be sufficient if the law is substantially linear), and preferably at least three, i.e. the number of separate SOHs is greater than or equal to three. Among the SOHs considered, the new state of the battery and at least one aged state may advantageously be integrated. In addition, in order to increase the precision of the method, it is also possible to memorize calibration data for multiple reference states of one and the same battery, which are, for example, distributed around one and the same peak and/or associated with different peaks.

Mention has been made of charging periods of the battery while describing the method. In a variant, the same steps could be implemented by using discharging periods. Both approaches, charging and discharging, may be cumulated and/or combined during calibration in order to subsequently offer greater precision and flexibility.

Moreover, the method has made use of the variation in the open-circuit voltage OCV of the battery as a function of the charge of the battery Qc but, in a variant, it could, in a similar manner, be based on the variation in the open-circuit voltage OCV as a function of time and the derivative of the open-circuit voltage with respect to time. In this latter case, it is then preferable to work according to a constant regime or while taking care to filter the voltage signal (low-pass filter).

The method has also not taken the temperature into consideration. However, if a pseudo-OCV definition that is sufficiently far removed from the theoretical open-circuit voltage is chosen, it may be useful to consider the temperature to be a variable in the method, and to implement the same calibration method for multiple different temperatures.

The method is applicable to a single battery, i.e. an elementary battery taking the form of an active storage part, based, for example, on chemical components or components of capacitive nature which are positioned in a housing, a first outer face of which forms the positive terminal or first current collector of the battery and a second outer face of which forms the negative terminal or second current collector. Functions of this housing are to hold and support the active part of the battery and to seal it with respect to the outside. It encloses a physical assembly that forms an indivisible monolithic unit that is fixed in place, whose electrical connections cannot be modified by a user of the elementary battery, where the output current is equal to the input current across its two terminals.

In a variant, the method is applicable to an electrical assembly of multiple elementary batteries, preferably having few dispersions and imbalances with respect to one another, and, in particular, to a battery pack comprising an electrical assembly connected in series having multiple modules comprising elementary batteries connected in parallel and/or in series.

According to the embodiment, once the calibration phase has, once and for all, been set up, the method may make use of the resulting calibration data in order to estimate the SOH of any battery of the same type, over the entire life of the battery, while it is in use. If necessary, the calibration phase could be restarted, for example in case of doubt regarding the quality of the calibration data, but this is not necessary for the implementation of the method for estimating the SOH which will be described below.

Thus, the method subsequently implements a method for estimating the SOH of a battery via a second phase P2 of estimating the SOH during the normal use thereof.

This second phase P2 consists in deducing the state of health of a battery from the calibration data, as soon as the battery is in the reference state, from the measurement or estimation of its open-circuit voltage in this reference state.

This second phase P2 comprises the following preliminary steps, for the purpose of triggering this second phase P2, according to the embodiment:
a step E12 of automatically detecting the electrical situation of the battery in order to detect whether it is close to the reference state, for example on the basis of the detection of its state of charge or its open-circuit voltage; or, in a variant,
a step E13 of modifying the configuration of the battery (charging or discharging) in order to place it in proximity to the reference state.

Another preliminary step E11 for triggering the second phase P2 may be based on one of the following steps:
E11a: trigger command subsequent to a request from a user via a human-machine interface of the device in which the battery is used or of a battery charging device;
E11b: automatic triggering at a predefined frequency;
E11c: automatic triggering when the electrical conditions of the battery are favorable, i.e. when it is close to the reference state;
E11d: automatic triggering in one phase of charging a battery (this charging phase being triggered independently, for example due to the battery being severely discharged).

Steps E11 and E12 or E13 may potentially be cumulated.

Next, the method implements a step E14 that is subsequently based on a period of charging, or, in a variant, of discharging, the battery, in which the open-circuit voltage is measured or estimated and/or the derivative of the measured or estimated open-circuit voltage. This step is not necessarily carried out under conditions that are the same as those under which the calibration phase was carried out, in particular the charging conditions may, in this instance, be nominal.

Next, the method implements a step E15 of detecting a peak in the derivative of the open-circuit voltage of the battery, a step E16 of placing the battery in its reference state and of measuring the open-circuit voltage in the reference state, then a step E17 of deducing its state of health from the calibration data and the measured open-circuit voltage. These steps are not described in detail since they are similar to those explained for the calibration.

Of course, the method may comprise a last step E19 of transmitting this estimation of the SOH to an operator, via a human-machine interface of a device for estimating the SOH.

The preceding method has been described on the basis of the commonest approach for defining the state of health of a battery, which consists in considering the loss of capacity to store a quantity of charge. In a variant, the same method may be adjusted in order to estimate the state of health of a battery according to another approach, for example by considering its loss in terms of potential to release energy over time. In such an approach, the method may be adjusted by replacing the quantities of charge with quantities of energy.

Moreover, the invention may be implemented with various types of battery. It is particularly suited to lithium-ion batteries based on manganese or on any other type of technology exhibiting similar behavior from the point of view of the invention.

As stated above, the illustrated curves were obtained in a phase of charging a battery. Conversely, the same phenomenon has been observed in a discharging phase. Thus, the embodiment could, conversely, be implemented for a discharging phase.

It would also be possible to envisage, in a variant, the derivative of the open-circuit voltage by time, in particular in the case of charging or discharging according to a constant regime.

Lastly, the embodiment of the invention has the following advantages:
it has the advantage of not requiring the battery to be fully charged or discharged, but of being able to estimate its state of health in a non-intrusive manner, while the battery is being used, when it passes through its intermediate reference state, which is easy to identify;

the calculations implemented in the second phase P2 are simple, thereby allowing the implementation thereof without requiring a large amount of computing power, and therefore compatible with implementation within any device, such as a mobile object of, potentially, small size;

the approach can easily be generalized to any type of battery, it is sufficient to reproduce the calibration phase at least once for each type of battery;

the method has shown, in practice, that it allows a very high level of precision to be reached;

the method can be implemented rapidly, thereby making it non-intrusive, since it may easily be implemented in an opportunistic manner when the battery is close to its reference state, without interrupting the normal operation of the battery.

The invention also pertains to a device for estimating the state of health of a battery comprising a management unit implementing the method for estimating the state of health (SOH) of the battery such as described above, via software and/or hardware components. For this purpose, the management unit comprises a computer, is associated with at least one electronic memory storing, in particular, the numerical data output by the first calibration phase, i.e. the calibration data, and calculation software implementing all or some of the method for estimating the state of health (SOH). The invention moreover pertains to such software per se. The device also comprises a human-machine interface allowing a user to be informed of the state of health of the battery, and to interact with it in order to define certain parameters of the method, for example the conditions for triggering the estimation. Lastly, the device comprises at least one sensor for measuring the voltage and/or the current and/or the temperature, connected to a means for communicating with the management unit. It should be noted that the device for managing the battery, which implements the method for estimating its state of health, may be integrated into the battery itself.

The invention also pertains to a device equipped with a battery, which comprises such a device for estimating the state of health of the battery.

The invention also pertains to a battery calibration device, which allows the steps of detecting a peak in the derivative of the open-circuit voltage to be implemented. This device therefore also comprises a computer and an electronic memory receiving the calibration data and other data to be memorized, to be used in future by an estimation device. This calibration device may also comprise a component implementing cycles of charging and discharging a battery, in order to place it in a chosen state of health.

By way of non-limiting example, the estimation method may thus be integrated within an automotive vehicle, in particular a hybrid or electric vehicle, and it may be implemented during the normal operation of the automotive vehicle. It may also be implemented in a battery charger or, more specifically, in a vehicle charging point. It may also be implemented within any mobile object, such as a laptop computer, a tablet, a mobile telephone, a personal digital assistant, etc.

The invention claimed is:

1. A method for calibrating a battery allowing calibration data linked to a state of health of the battery to be memorized, comprising:
    determining at least one characteristic state of the battery, intermediate between fully charged and fully discharged, by:
        measuring an open-circuit voltage while charging or discharging the battery,
        after the measuring the open-circuit voltage, calculating a derivative of the open-circuit voltage, and
        detecting a peak in a variation of the derivative of the open-circuit voltage;
    defining a reference state of the battery based on the characteristic state; and
    measuring the open-circuit voltages of the battery in the reference state for multiple different states of health and memorizing the calibration data comprising at least some pairs of actual state of health/open-circuit voltage values in an electronic memory.

2. The method for calibrating a battery as claimed in claim 1, wherein the determining at least one characteristic state of the battery takes into account the derivative of the open-circuit voltage with respect to the quantity of charge accumulated by the battery or with respect to time.

3. The method for calibrating a battery as claimed in claim 1, wherein the reference state is chosen in a stabilized area of the derivative of the open-circuit voltage in proximity to the peak of the detected characteristic state.

4. The method for calibrating a battery as claimed in claim 3, wherein the reference state is defined by a shift by a fixed charge in the charge accumulated by the battery with respect to the charge at the detected peak.

5. The method for calibrating a battery as claimed in claim 1, further comprising repetition of the following steps for multiple different states of health of at least one battery:
    placing a battery in a known and chosen state of health;
    charging or discharging the battery, measuring and/or estimating the derivative of the open-circuit voltage of the battery and detecting a predefined peak in the derivative;
    continuing to charge or discharge a predefined quantity of charge based on the predefined peak in order to attain the reference state of the battery, and measuring the open-circuit voltage in the reference state; and
    memorizing, in an electronic memory comprising the calibration data, the pair of values comprising the value of the state of health and the open-circuit voltage associated with the reference state of the battery.

6. The method for calibrating a battery as claimed in claim 1, further comprising implementing phases of slow charging or discharging of the battery in order to facilitate the measurement of the open-circuit voltage.

7. The method for calibrating a battery as claimed in claim 1, wherein the measuring the open-circuit voltage of the battery includes one of the following steps:
    measuring a voltage across terminals of the battery when not connected to a load after a relaxation time of more than one hour; or
    measuring the voltage across the terminals of the battery when not connected to a load after a relaxation time of less than or equal to one hour; or
    measuring the voltage across the terminals of the battery despite a very weak current delivered or received by the battery; or
    measuring the voltage across the terminals of the battery under different conditions of a theoretical open-circuit voltage and implementing a correction for the measured voltage in order to estimate the open-circuit voltage; and
    estimating the open-circuit voltage of the battery on the basis of one or more measured electrical quantities of the battery.

8. The method for calibrating a battery as claimed in claim 1, further comprising determining a law between the state of health of the battery and the open-circuit voltage in the reference state through linear interpolation and/or construction of a chart associating a value of the state of health of the battery with a value of the open-circuit voltage of the battery in a reference state, based on the pairs of actual state of health/open-circuit voltage values.

9. The method for calibrating a battery as claimed in claim 1, wherein the method is implemented using at least one battery of the family of batteries in a new state, and using the same battery in at least one aged state.

10. A method for estimating the state of health of a battery, comprising:
  implementing, in a calibration phase, the calibration method as claimed in claim 1; and
  estimating, in an estimation phase, the state of health of the battery comprising the measurement of the open-circuit voltage in the reference state and deducing the estimation of the state of health from the calibration data obtained in the calibration phase and from the measured open-circuit voltage.

11. The method for estimating the state of health of a battery as claimed in claim 10, wherein the estimation phase comprises at least one of the following preliminary steps, for the purpose of determining triggering of the estimation phase:
  triggering a command subsequent to a request from a user via a human-machine interface of a device in which the battery is used or of a battery charging device;
  automatic triggering at a predefined frequency;
  automatic triggering when electrical conditions of the battery are favorable;
  automatic triggering in one phase of charging a battery;
  automatically detecting the electrical situation of the battery in order to detect the characteristic state; and
  modifying a configuration of the battery in order to place the battery in proximity to the reference state.

12. The method for estimating the state of health of a battery as claimed in claim 11, further comprising:
  measuring or estimating the derivative of the open-circuit voltage while charging or discharging the battery;
  detecting a peak in the derivative of the open-circuit voltage;
  placing the battery in the reference state based on the peak in the derivative of the open-circuit voltage, and measuring the open-circuit voltage of the battery; and
  deducing the state of health of the battery from the calibration data and from the measured open-circuit voltage.

13. A non-transitory computer readable medium comprising a recorded computer program that, when executed by a computer, causes the computer to execute the method for estimating the state of health of a battery as claimed in claim 10.

14. A device comprising:
  at least one battery and one management unit, wherein the management unit is configured to implement the method for estimating the state of health of at least one battery as claimed in claim 10.

15. The device as claimed in claim 14, wherein the device is an automotive vehicle, a computer, a telephone, a tablet or a personal digital assistant.

16. A device for calibrating a battery, wherein the device is configured to implement the calibration method as claimed in claim 1.

17. The method for calibrating a battery as claimed in claim 1, wherein the peak in the variation of the derivative of the open-circuit voltage corresponds to the characteristic state in which a phase change occurs in electrodes of the battery.

* * * * *